United States Patent
Sasaki et al.

(10) Patent No.: US 9,536,930 B2
(45) Date of Patent: Jan. 3, 2017

(54) DISPLAY DEVICE

(71) Applicant: Japan Display Inc., Tokyo (JP)

(72) Inventors: Tohru Sasaki, Tokyo (JP); Toshihiro Sato, Tokyo (JP); Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 94 days.

(21) Appl. No.: 14/474,470

(22) Filed: Sep. 2, 2014

(65) Prior Publication Data

US 2015/0060827 A1 Mar. 5, 2015

(30) Foreign Application Priority Data

Sep. 2, 2013 (JP) .................................. 2013-181418

(51) Int. Cl.
*G02F 1/13* (2006.01)
*G02F 1/1362* (2006.01)
(Continued)

(52) U.S. Cl.
CPC ......... *H01L 27/322* (2013.01); *H01L 51/5284* (2013.01)

(58) Field of Classification Search
CPC ................. H01L 2924/0002; H01L 27/14623; H01L 29/78633; H01L 27/12; H01L 27/3225; H01L 27/3248; H01L 27/3272; H01L 33/58; H01L 51/5268; H01L 27/14818; H01L 51/5284; H01L 27/14605; F21L 14/023; F21Y 2105/003; F21Y 2113/002; F21Y 2113/005; F21V 7/0083; F21S 10/023; F21S 10/007; G02F 1/136209; G02F 2001/1351; G02F 2201/501
(Continued)

(56) References Cited

U.S. PATENT DOCUMENTS 6,249,325 B1 * 6/2001 Ohkawara ......... G02F 1/136213
349/38
6,567,136 B1 * 5/2003 Sakuramoto ...... G02F 1/136209
349/110
(Continued)

FOREIGN PATENT DOCUMENTS

CN 1343905 A 4/2002
CN 1407837 A 4/2003
(Continued)

OTHER PUBLICATIONS

Examiner's Notice of Reason for Rejection by TIPO received on Jan. 18, 2016 for corresponding Taiwanese application 103125588.
(Continued)

*Primary Examiner* — Mary Wilczewski
*Assistant Examiner* — Tsz Chiu
(74) *Attorney, Agent, or Firm* — Typha IP LLC

(57) ABSTRACT

In a display device including an device substrate arranged with a plurality of pixels arranged with a light emitting device, a color filter layer with different transmission bands corresponding to each of the pixels, and a color filter substrate arranged with an overcoat layer above the color filter layer, by arranging a first light shielding layer arranged corresponding to a matrix of pixels and a second light shielding layer wider than the first light shielding layer and separated from the first light shielding layer and on a side close to a pixel, light emitted in a diagonal direction leaking to an adjacent pixel enters the second light shielding layer and by increasing the length of a light path of the incident light, the light is absorbed and attenuated by the second light shielding layer and improvements in viewing angle characteristics are achieved without decreasing the aperture ratio of a pixel.

15 Claims, 19 Drawing Sheets

(51) Int. Cl.
*G02F 1/136* (2006.01)
*H01L 27/32* (2006.01)
*H01L 51/52* (2006.01)

(58) Field of Classification Search
USPC .......................................... 349/43, 110, 111
See application file for complete search history.

(56) References Cited

U.S. PATENT DOCUMENTS

| | | | |
|---|---|---|---|
| 2001/0019384 A1* | 9/2001 | Murade | G02F 1/133512 349/110 |
| 2002/0036818 A1* | 3/2002 | Kawata | G02F 1/136209 359/254 |
| 2003/0042848 A1 | 3/2003 | Park et al. | |
| 2010/0141877 A1* | 6/2010 | Huang | B29D 11/00634 349/106 |
| 2011/0062859 A1 | 3/2011 | Kawamura | |
| 2012/0250303 A1 | 10/2012 | Asaki et al. | |
| 2014/0346477 A1* | 11/2014 | Chao | H01L 51/0024 257/40 |
| 2015/0301400 A1* | 10/2015 | Kimura | G02F 1/133512 349/43 |

FOREIGN PATENT DOCUMENTS

| | | |
|---|---|---|
| CN | 102193238 A | 9/2011 |
| CN | 102738196 A | 10/2012 |
| JP | 2012-209201 A | 10/2012 |
| KR | 2000-0048125 A | 7/2000 |
| KR | 10-2008-0057433 A | 6/2008 |
| TW | 201003144 A | 1/2010 |
| TW | 201014443 A | 4/2010 |

OTHER PUBLICATIONS

Office Action by KIPO received on Feb. 15, 2016 for corresponding Korean Patent Application No. 10-2014-0112869.
Chinese Examiner's Notice of Reason for Rejection mailed on Nov. 2, 2016 for corresponding Chinese Application No. 201410443034.8 with partial translation.

* cited by examiner (A)

DISPLAY DEVICE

CROSS REFERENCE TO RELATED APPLICATIONS

This application is based upon and claims the benefit of priority from the prior Japanese Patent Application No. 2013-181418, filed on Sep. 2, 2013, the entire contents of which are incorporated herein by reference.

FIELD

One embodiment of the present invention is related to a display device, for example, the present invention is related to a an effective technology suitable for a top emission type display device using a light emitting devices such as an organic electroluminescence device.

BACKGROUND

Display devices arranged with a thin film transistor in pixels which control emitted light of a light emitting device such as an organic electroluminescence device are being developed. When these display devices are looked at from the incidence direction of light in the pixels, there is a bottom emission type which emits light to the side of a substrate formed with a thin film transistor, and a top emission type which emits light to the upper direction of a pixel. Among these, the top emission type is advantageous in that it is easier to raise the aperture ratio of a pixel compared to the bottom emission type.

In the case where a light emitting device which emits white light is used as the structure of a pixel, a color filter corresponding to red (R), green (G) and blue (B) is arranged on the light emitting side and a color display is performed. In the top emission type, a color filter is not formed directly on the light emitting device but overlaps with a substrate arranged with the color filter in order to face the substrate formed with the light emitting device. A color filter includes a color filter layer which allows light from each color region red (R), green (G) and blue (B) to pass through and a light shielding layer which prevents mixed colors is arranged on the boundary of each color filter.

FIG. 10 (A) is an example of this type of display device and an en exploded view of a part enclosed by the dotted line is shown in FIG. 10 (B). In the display device 10, a light emitting device 24 is formed by stacking a pixel electrode 16 via an insulation layer 14 above a bottom substrate 12, an organic electroluminescence layer (referred to herein as "organic EL layer") 20, and an upper part electrode 22. A bank layer 18 is arranged to cover the periphery edge section of the pixel electrode 14. A light shielding layer 32 is formed corresponding to the boundary region of the pixel electrode 14 on the upper substrate 30 and above this a color filter layer 34 and overcoat layer 36 are arranged.

In the light emitting device 24, light emitting at the organic EL layer 20 spreads in all directions of 4π when expressed as a solid angle. Light which proceeds in a roughly perpendicular direction from the organic EL layer 20 passes through the color filter layer 34 and is emitted from the upper substrate 30 (path a). Light which proceeds in the direction of the light shielding layer 32 from the organic EL layer 20 is absorbed by the light shielding layer 32 and never emitted to the exterior (path b). On the other hand, light which is emitted in a diagonal direction from the organic EL layer 20 becomes leak light towards an adjacent pixel (path c). Light which leaks to an adjacent pixel can pass through a different color filter layer to the color of its own pixel and thereby mixed colors are generated which affects display properties. In order to shield light leaking to an adjacent pixel, when a width W of the light shielding layer 32 is enlarged, an area of an aperture part which can allow light to pass through is compressed which leads to a decrease in the utilization efficiency of light emitted in the light emitting device.

When a light shielding layer arranged so as to enclose the outline of a color filter is made smaller for effects such as diffraction grating to operate and in order to achieve high resolution of a pixel, a problem is produced whereby light which has passed through an adjacent color filter is refracted and colors become mixed. As a result, even in the case where the size of a pixel is compressed, a display device is disclosed in Japanese Laid Open Patent 2012-209201 which is arranged with a wide translucent layer contacting a light shielding layer arranged on the side of the bottom layer of the color filters in order to suppress mixed colors due to refraction of light which has passed through an adjacent color filter.

The display device disclosed in Japanese Laid Open Patent 2012-209201 is formed in order to reduce light from leaking to an adjacent pixel using a structure of directly stacking a light shielding layer and a translucent layer having a wider width than the light shielding layer. However, since a color filter is present on the upper layer part of the light shielding layer and translucent layer, the distance from the light emitting device is large. As a result, if the width of the translucent layer is not significantly increased more than the light shielding layer, a problem is generated whereby light emitted in a diagonal direction can not be sufficiently absorbed. When the width of the translucent layer is increased, light emitted by a pixel in a perpendicular direction becomes absorbed by the translucent layer and thereby utilization efficiency of light is significantly decreased.

SUMMARY

A display device according to one embodiment of the present invention includes an device substrate arranged with a plurality of pixels each of which is arranged with a light emitting device, and a color filter substrate having a color filer layer with different transparent wavelength bands corresponding to each of the pixels, the color filter layer arranged above a translucent support substrate, wherein the color filter substrate includes a first light shielding layer arranged corresponding to a boundary region arranged with the pixels, and a second light shielding layer arranged to overlap the first light shielding layer, the second light shielding layer sandwiching the color filter layer, the second light shielding layer having a higher transparency than the first light shielding layer and a lower transparency than the translucent support substrate, and the second light shielding layer is wider than the first light shielding layer and is arranged on the side of the light emitting device than the first light shielding layer.

A display device according to one embodiment of the present invention includes an device substrate arranged with a plurality of pixels each of which is arranged with a light emitting device, and a color filter substrate having a color filter layer with different transparent wavelength bands corresponding to each of the pixels, the color filter layer arranged above a translucent support substrate, wherein the color filter substrate includes a first light shielding layer arranged corresponding to a boundary region arranged with the pixels on the translucent support substrate side of the color filter layer, and a second light shielding layer arranged on the opposite side of the translucent support substrate of the color filter layer to overlap the first light shielding layer, the second light shielding layer sandwiching the color filter layer, the second light shielding layer having a higher transparency than the first light shielding layer and a lower transparency than the translucent support substrate, and the second light shielding layer is wider than the first light shielding layer.

A display device according to one embodiment of the present invention includes an device substrate arranged with a plurality of pixels each of which is arranged with a light emitting device, and a color filter substrate having a color filter layer with different transparent wavelength bands corresponding to each of the pixels, the color filter layer arranged above a translucent support substrate, wherein the color filter substrate includes a first light shielding layer arranged corresponding to a boundary region arranged with the pixels on a bottom layer side of the color filter layer, the device substrate includes a sealing layer arranged on a top layer side of the light emitting device, and a second light shielding layer arranged corresponding to a boundary region arranged with the pixels above the sealing layer, the second light shielding layer having a higher transparency than the first light shielding layer and a lower transparency than the translucent support substrate, and the second light shielding layer is wider than the first light shielding layer.

DESCRIPTION OF EMBODIMENTS

The embodiments of the present invention are described below while referring to the diagrams etc. However, the present invention may be performed by many different modes and should not be interpreted as being limited to the descriptions in the embodiments exemplified herein.

Furthermore, with regards to the contents of the invention explained herein, the same parts or parts having similar functions are used in common between different diagrams using the same reference symbols and in these cases, as long as there are no particular circumstances requiring explanation, repeated explanations are omitted.

[First Embodiment]

(1) Entire Structure of a Display Device

Figure 1:
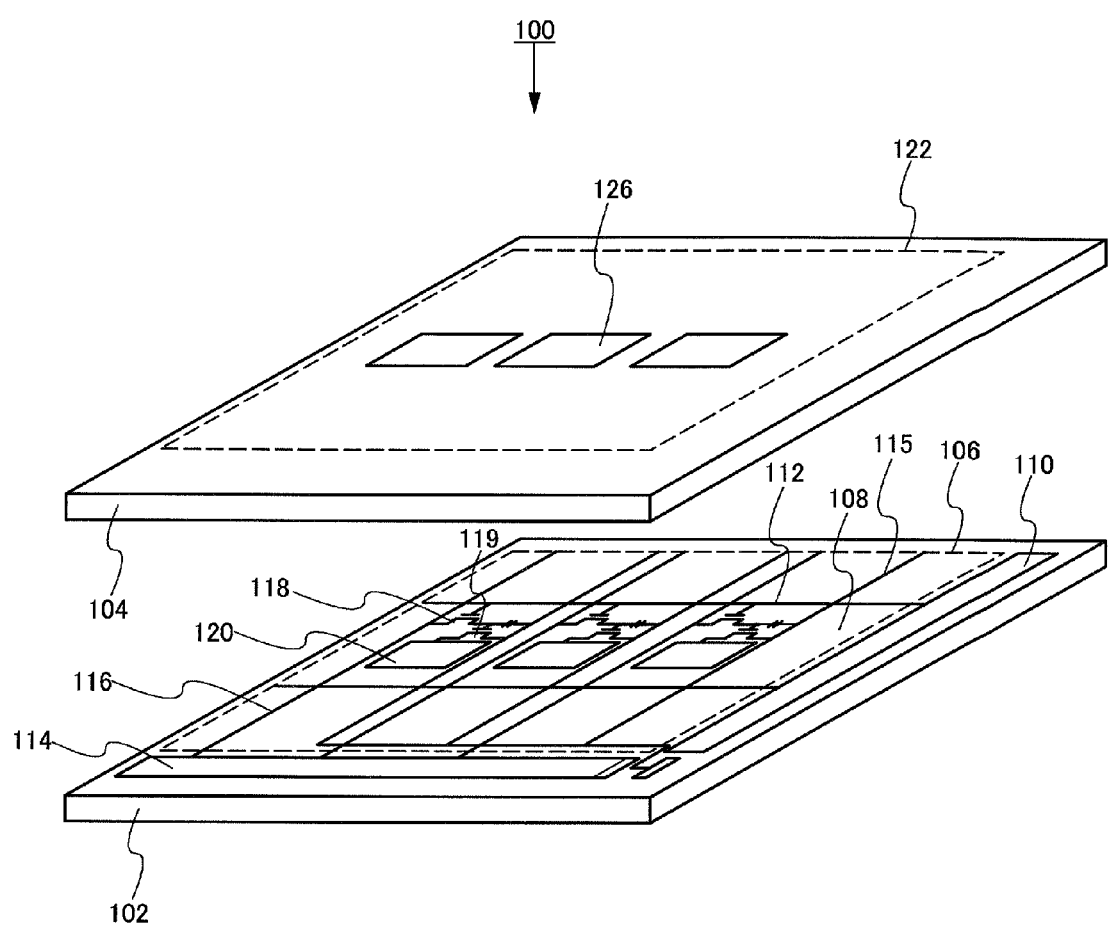
FIG. 1 is a perspective view diagram for explaining the structure of a display device related to one embodiment of the present invention.

FIG. 1 shows a structural example of a display device 100. The display device 100 is formed from a device substrate 102 and a color filter substrate 104. A pixel region 106 arranged with pixels 108, a gate signal line driving circuit 110 and a data signal line driving circuit 114 is arranged in the device substrate 102. A signal output from the gate signal line driving circuit 110 is supplied to a gate signal line 112, and a data signal output from the data signal line driving circuit 114 is supplied to a data signal line 116. The gate signal line 112 and data signal line 116 are connected with a transistor 118 arranged in the pixel 108. A selection transistor 118 input with a selection signal input from the gate signal line 112 and input with data signal from the data signal line 116, and a driving transistor input with a signal from the selection transistor 118 and which controls a connection between a light emitting device 120 and a power supply line 115, are arranged in a pixel 108. A color filter 112 is arranged in a position corresponding to a pixel 108 in the color filter substrate 104. A color filter layer 126 (R color filter layer 126r, G color filter layer 126g, B color filter layer 126b) is arranged corresponding to each color pixel (R pixel 108r, G pixel 108g, B pixel 108b) such as red (R), green (G) and blue (B) in the pixel region 106.

In the display device shown in FIG. 1, the color of the emitted light of a light emitting device arranged in each pixel may also be made to display monochrome as a single color, light emitting devices which emit light of each color red (R), green (G) and blue (B) may be arranged in each pixel or a pixel emitting white light (W) may be further arranged to display color.

Figure 2A:
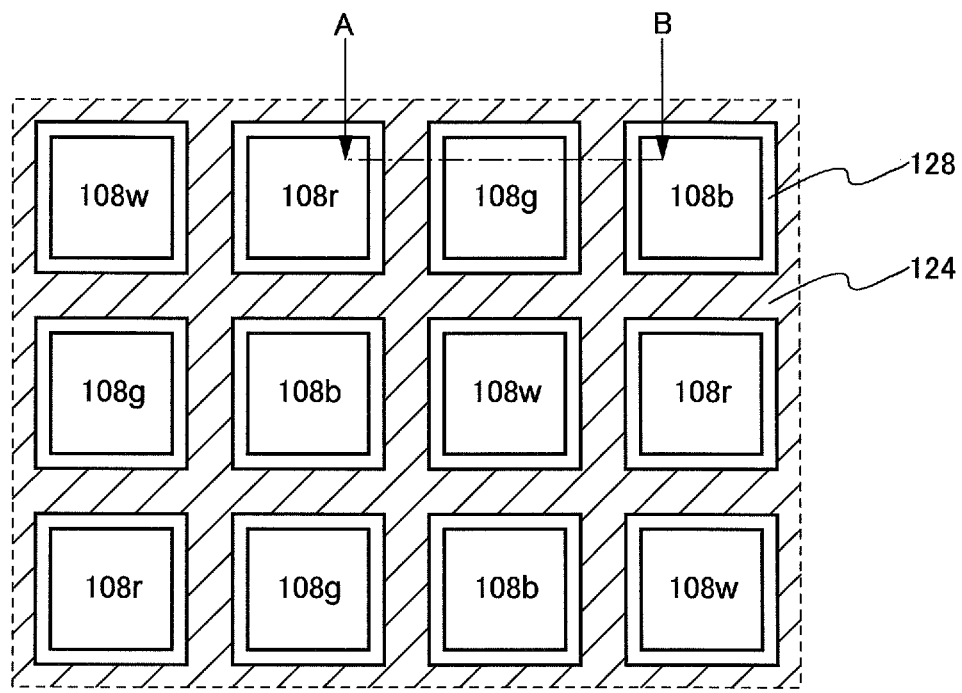
FIGS. 2A and 2B is a planar view diagram for explaining the structure of a pixel region of a display device related to one embodiment of the present invention.
Figure 2B:
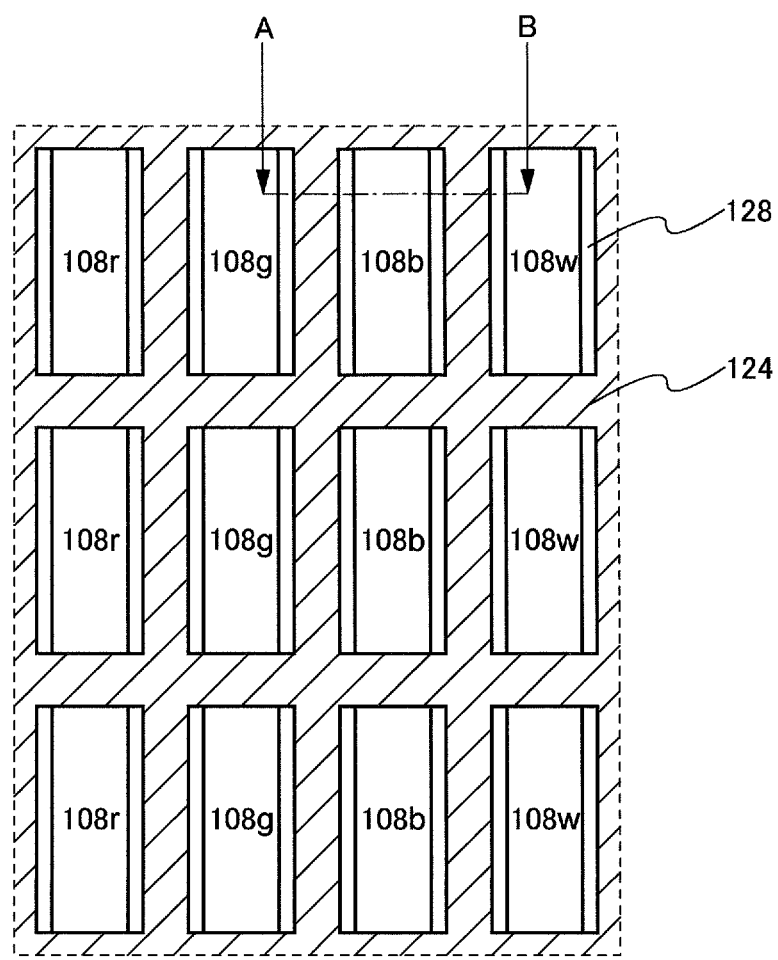

FIG. 2 (A) shows the appearance of the pixel region 106 seen from the side of the color filter substrate 104. FIG. 2 (A) shows an example of pixels (R pixel 108r, G pixel 108g, B pixel 108b) of each color such as read (R), green (G) and blue (B), arranged diagonally. A first light shielding layer 124 is arranged on the boundary region of each pixel 108. A second light shielding layer 128 is arranged to enclose the outline of each pixel 108 (R pixel 108r, G pixel 108g, B pixel 108b). The second light shielding layer 128 has a higher transparency than the first light shielding layer 124 and is formed from a thin metal film or resin with light absorbing properties. Furthermore, in FIG. 2 (A), a white color pixel 108w may also be included in a pixel 108. In the white color pixel 108w, although light may be allowed to pass through to the light emitting device unchanged, due to the relationship with a pixel which emits light of another color, a color filter layer set so as to increase the spectral intensity of a specific wavelength band in approximately white light may also be arranged.

FIG. 2 (B) shows the appearance of the pixel region 106 when a color filter layer of each color pixel 108 (R pixel 108r, G pixel 108g, B pixel 108b) is arranged in a stripe shape. In this case, since a color filter layer of the same color is arranged in the same column direction, the second light shielding layer 128 is arranged only in a region where a color filter layer of a different color is adjacent. A white color pixel 108w may also be arranged in the case of FIG. 2 (B) the same as in FIG. 2 (A).

Furthermore, although not shown in the diagram, it is possible to similarly apply a the above structure of the light shielding layer and the color filter layer to pixels arranged in a delta arrangement or "PenTile" arrangement. In the display device related to the present embodiment, since the relationship between a light shielding layer and a translucent layer can also be applied regardless of the arrangement of pixels, a pixel region including the arrangement described above is included in the explanation given below and other arrangements which can be applied are also explained.

Figure 3A:
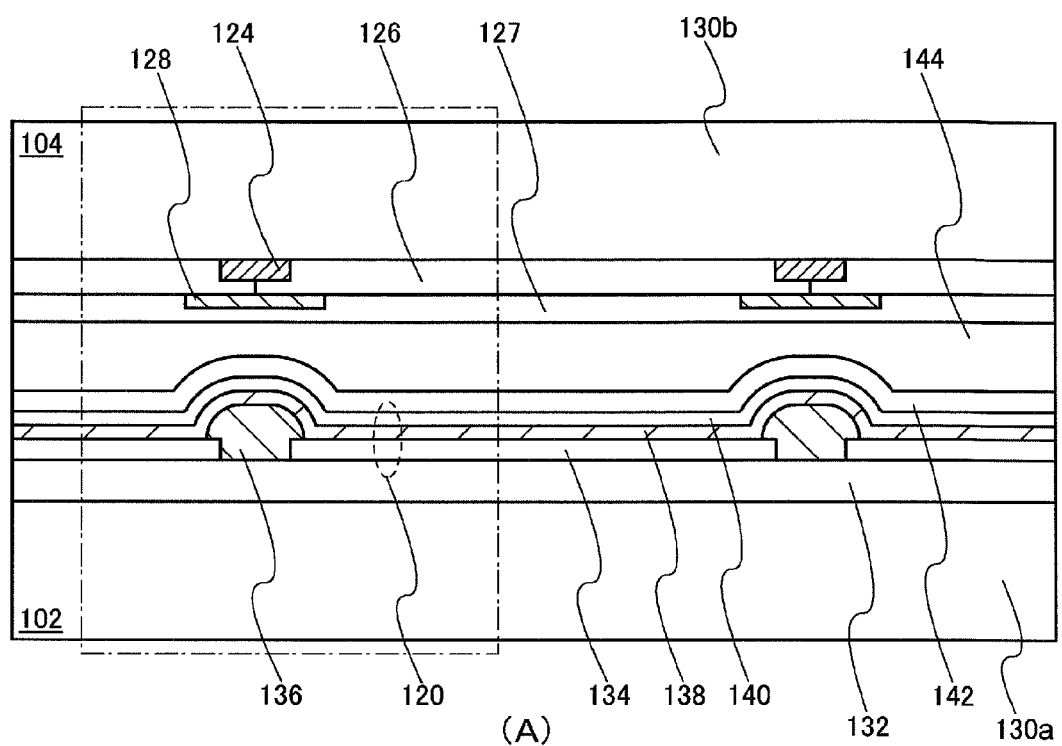
FIG. 3A is a cross-sectional view of the structure of a pixel region of a display device related to one embodiment of the present invention.
Figure 3B:
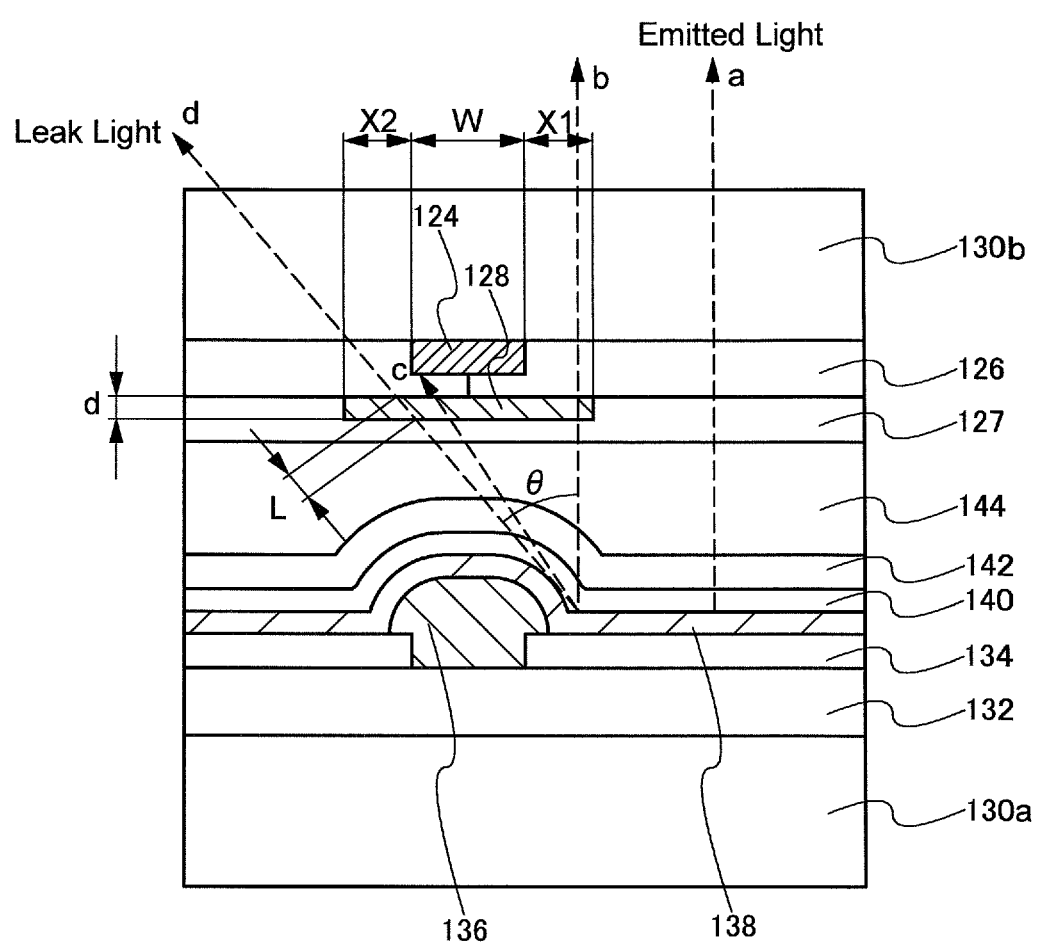
FIG. 3B explains the structure of a pixel region of a display device related to FIG. 3A, and is a diagram for explaining the appearance when light emitted in a diagonal direction by a second light shielding layer is absorbed.

A cross-sectional structure of the pixel region 106 corresponding to the line A-B shown in FIGS. 2 (A) and (B) is shown in FIG. 3. In FIGS. 2 (A) and (B), although the arrangement of color filter layers 126 is different, since the cross-sectional structure corresponding to the line A-B shown in the same diagram is common, the structure shown in FIG. 3 shows the both of these cases.

(2) Structure of a Pixel Region

FIG. 3 (A) shows an example of a cross-sectional structure of the pixel region 106 in a display device, and an expanded view of the section enclosed by the dotted line is shown in FIG. 3 (B). The pixel region is arranged so that the pixel substrate 102 arranged with light emitting device 120, and a color filter substrate 104 arranged with a color filter layer face each other and a filler material 144 comprised from an organic resin material such as acryl for example is present between the two substrates. Although the thickness of the filler material 144 is arbitrary, it is preferred that the material is arranged so that the thickness at the upper part of the light emitting device 120 becomes 1 μm~4 μm and preferably 2 μm~3 μm. When the thickness of the filler material 144 is too thin, the mechanical strength of the display device is no longer sufficiently maintained and if the material 144 is too thick, light emitted from a pixel is attenuated and therefore the film thickness described above is preferred.

(a) Device Substrate

The structure of a device substrate 102 is roughly as follows. A pixel electrode 134 is arranged for each pixel above an insulation layer 132 formed on a support substrate 130a. A bunk layer 136 is arranged so as to cover a periphery edge part of the pixel electrode 134. The organic EL layer 134 and upper part electrode 140 are arranged above the pixel electrode 134 and may further extend as far as the bunk layer 136. The upper par electrode 140 is a common electrode which is provided with a common potential between each pixel and is arranged to be linked with a plurality of pixels. A sealing layer 142 formed from a silicon nitride film for example is arranged roughly on the entire surface of an upper layer of the upper part electrode 140. The thickness of the sealing layer 142 is formed to 200 nm~4000 nm, more preferably 300 nm~3000 nm. Although a silicon nitride film is suitable for the sealing layer, it sometimes displays slight light absorbing properties with respect to short wavelength light and if it is formed with the film thickness range described above, it is possible to treat it as a light transparent film without loss of a sealing function.

The light emitting device 120 is formed in a region where the pixel electrode 134, organic EL layer 138 and upper electrode 140 overlap. In the light emitting device 120, the pixel electrode 134 and upper electrode 140 include functions whereby one becomes an anode (electrode on the side which injects positive holes) and the other becomes a cathode (electrode which injects electrons). Although the anode and cathode are formed from each type of conductive material, usually the anode is formed with a material with a higher work function with respect to the cathode.

For example, in order to make the pixel electrode 134 a light reflective electrode and use this as the anode, it is preferred to use a metal material such as titanium (Ti), titanium nitride (TiN), platinum (Pt), nickel (Ni), chrome (Cr) and tungsten (W). Because these metals have a lower reflectance compared with aluminum (Al) or silver (Ag), it is preferable to apply a multilayer structure by arranging an indium tin oxide (ITO) layer which has a higher work function on the side which contacts with the organic EL layer 138 and on the bottom layer of thereof, a layer of aluminum (Al) or silver (Ag) which becomes a light reflecting surface as a structure for increasing light reflectance as a light reflecting electrode.

In order to make the upper electrode 140 a cathode, it is preferable to use for example, calcium (Ca) or magnesium (Mg) to aluminum or a material containing an alkali metal such as lithium (Li). In addition, in order to provide light reflectance when using the upper electrode 140 as a cathode, the metal layer described above may be formed to a thickness of 50 nm~200 nm in order to allow light pass through or further stack a transparent conductive film such an indium tin oxide (ITO) or indium tin zinc oxide (IZO) thereupon.

On the other hand, in order to make the pixel electrode 134 a light reflective electrode and use this as the cathode, a metal material such as aluminum or silver (Ag) may be used as described above. In addition, n order to make the upper electrode 140 a light reflective electrode and use this as the anode, a transparent conductive film such an indium tin oxide (ITO) or indium tin zinc oxide (IZO) may be used.

The organic EL layer 138 may be formed using either a low molecular or high molecular organic material. For example, in the case where a low molecular organic material is used, in addition to a light emitting layer including an organic material having light emitting properties, the organic EL layer 138 is formed including a hole transport layer or an electron transport layer so as sandwich the light emitting layer. In the light emitting device 120, in order to emit white light, a structure may be adopted whereby a light emitting layer or light emitting device which emits light of each color red (R), green (G) and blue (B) are stacked or a structure whereby a light emitting layer or light emitting device which emit blue (B) and yellow (Y) light are stacked.

The thickness of the organic EL layer 138 is about 100 nm to 300 nm even when each the film thickness of each layer is added together. As a result, when an edge part of the pixel electrode 134 is exposed as it is, since the organic EL layer 138 can not sufficiently cover this edge part, when the upper electrode 140 is formed above this, a short is caused with pixel electrode 134. The bank layer 136 includes a function which prevents these type of shorting defects, and in addition to covering the edge part of the pixel electrode 134, it is preferred that a surface of the organic EL layer 138 is formed with a curved shape so that the layer is formed uniformly. This type of bank layer 136 is formed from an inorganic insulation material such as silicon dioxide ($SiO_2$) or silicon nitride ($Si_3N_4$), or an organic insulation material such as an acryl resin or polyimide resin. For example, if an organic resin material having photosensitive properties is used, it is possible to form the upper edge part with a round band shape by appropriately adjusting photo-exposure or exposure time.

(b) Color Filter Substrate

The structure of a color filter substrate 104 is roughly as follows. A first light shielding layer 124 is formed corresponding to a boundary region of the pixel electrode 134 (or a region formed with the bank layer 136) above a support substrate 130b having translucency. Because the support substrate 130b having translucency is arranged on the side where light emitted at the light emitting device 120 is emitted, it is preferred that at least light in the visible light band which enters perpendicularly has transparency of 80% or more, and more preferably 80%~100% for example.

A color filter 122 is arranged above the first shielding layer 124. The color filter layer 126 includes a plurality of layers having different transparent light wavelength bands corresponding to each color of a pixel (for example, as is shown in FIG. 3 (A), red (R) color filter layer 126r, green (G) color filter layer 126g and blue (B) color filter layer 126b). The color filter layer 126 is formed to a thickness of about 3 μm from an organic resin material including a pigment or dye. The first shielding layer 124 is arranged to overlap a boundary region in a part where color filter layers of different colors are adjacent.

An overcoat layer 127 formed from on organic resin material having translucency such as acryl is arranged above the color filter layer 126. The overcoat layer 127 has a thickness of about 2 μm with the aim of protecting the color filter layer 126 and in order to make the surface flat. The transparency of the overcoat layer 127 is preferred to be larger than 70% with respect to the wavelength of light in the visible light band, and more preferably 80%~95% for example. Furthermore, it also possible to omit the overcoat layer 127.

In FIG. 3, a second light shielding layer 128 is arranged between the color filter layer 126 and the overcoat layer 127. The transparency of the second light shielding layer 128 is higher than the first light shielding layer 124 and is lower than the overcoat layer 127. Although the second light shielding layer 128 is arranged to overlap the first light shielding layer 124, the color filter layer 1226 exists between these. As a result, in a pixel region, the second light shielding layer 128 is arranged in a position closer to the light emitting device 120 than the first light shielding layer 124. In addition, the width of the second light shielding layer 128 is wider than the width of the first light shielding layer 124. For example, as is shown in FIG. 3 (B), when the width of the first light shielding layer is W, the width of the second light shielding layer 128 becomes a total (W+X1+X2) of a width X1 protruding from a pixel and a width X2 protruding from an adjacent pixel in addition to the width W of the first light shielding layer 124.

The first light shielding layer 124 is formed to a thickness so that light does not pass through using a metal such as chrome (Cr), titanium (Ti) or tantalum (Ta). For example, the first light shielding layer 124 is preferred to be formed from a metal such as chrome (Cr), titanium (Ti) or tantalum (Ta) to a thickness of 200 nm~500 nm and more preferably 200 nm~300 nm. When the film thickness of the first light shielding layer is thin, light passes through and thus cannot function sufficiently as a light shielding layer, and when the film thickness is too thick, steps are formed in the color filter which is not desirable. The transparency of the first light shielding layer is preferred to be less than 25%.

The second light shielding layer 128 is formed from a metal thin film such as chrome (Cr), titanium (Ti) or tantalum (Ta) and is formed thinly so that light can pass through, or is formed from a resin material having light absorbing properties including black pigments such as titanium black or carbon black. Although the thickness of the second light shielding layer 128 is preferred to be about 150 nm in order to allow a certain amount of light to pass through, it is sufficient to set a suitable thickness considering optical properties as is shown below. Although the transparency of the second light shielding layer 128 can be appropriately adjusted by changing the thickness of a metal film or by changing the concentration of a black pigment, the transparency of the second light shielding layer 128 is set higher than the first light shielding layer 124 and lower than the overcoat layer 127 formed from an organic resin material having translucency.

For example, the second light shielding layer 128 is preferred to have optical characteristics of 25%~70% as light transparency in the visible light band in the thickness direction of the layer (thickness d shown in FIG. 3 (B)). By providing the second light shielding layer 128 with a thickness in this range, in a pixel region, light is allowed to be emitted from a light emitting device without significant attenuation, emitted light which leaks diagonally to an adjacent pixel is sufficiently absorbed and it is possible to reduce the effects of leaking light. On the other hand, when the characteristics of the first light shielding layer 124 are expressed as the attenuation ratio of incident light in the thickness direction of the layer, it is preferred to have a value of 3.0 or more as optical density (OD value). By providing the first light shielding layer 124 with this characteristic value it is possible to block incident light and increase light shielding properties. That is, by providing optical characteristics of the second light shielding layer in this range, it is possible to allow light emitted from a light emitted in the pixel region to pass through without significant attenuation, sufficiently absorb emitted light which leaks diagonally to an adjacent pixel and reduce the effects of leaking light.

(3) Light Shielding Layer and Semi-Transparent Layer

In a central region of the light emitting device 120, among light emitted at the organic EL layer 138, light emitted in a roughly perpendicular direction (path a) and light which passes through the second light shielding layer 128 (path b) passes through the upper electrode 140, the sealing layer 142, the filling layer 144, the overcoat layer 127 and the color filter 126 and light within a certain wavelength range is extracted to the exterior. On the other hand, near an edge part of the light emitting device 120, after light emitted in a diagonal direction to an adjacent pixel passes through the sealing layer 142, filling layer 144 and overcoat layer 127, enters the second light shielding layer 128 which includes light absorbing properties from a diagonal direction.

Among the light emitted in a diagonal direction from the organic EL layer 138 towards an adjacent pixel, light of an angle close to a comparatively frontal direction (direction of the color filter substrate 104) arrives at the first light shielding layer 124 and is shielded (path c). However, as is shown in FIG. 3 (B), when light emitted diagonally at a large angle θ with respect to a perpendicular direction is not sufficiently absorbed by the second light shielding layer 128, because the light reaches a color filter with a different color of an adjacent pixel, leaking light in an unintended wavelength range is possible (path d).

However, in the structure of a pixel region related to the present embodiment, since the second light shielding layer 128 is arranged so that the distance with the organic EL layer 138 becomes smaller, it is possible to sufficiently reduce leaking light to an adjacent pixel. Specifically, when the thickness of the second light shielding layer 128 is d, the light path length L which allows light emitted in a direction at an angle θ to pass through the second light shielding layer 128 becomes L=d/cos θ. For example, L=d/cos)(60°) in the case where the angle θ=60. In addition, if the transparency in the thickness direction of the second light shielding layer 128 is set at 30%, transparency in the angle θ=60° direction becomes T (L/d)=0.3$^{3.2}$=0.09=9% and thus 91% light does not pass through. That is, by separating the second light shielding layer 128 including a light shielding function from the first light shielding layer 124, and arranging the second light shielding layer 128 in the vicinity of the organic EL layer 138, it is possible to sufficiently reduce the intensity of light leaking to an adjacent pixel without increasing the width of the first light shielding layer 124. In this way, it is possible to reduce the effects of mixed colors without significantly reducing the aperture ratio of a pixel and thus achieve improvements in viewing angle characteristics.

Furthermore, as is disclosed in patent document 1, in a structure where a wide semi-transparent layer is arranged to contact a light shielding layer, it is necessary to increase the width of X1 and X2 in order to sufficiently absorb light in a diagonal direction emitted in the angle θ direction described above. In this case, because the semi-transparent layer protrudes significantly into an inner region of a pixel, emitted light of that pixel becomes attenuated and therefore there is substantial drop in an aperture ratio.

However, in the display device shown in the present embodiment, the first light shielding layer 124 the second light shielding layer 128 corresponding to a semi-transparent layer are arranged between the color filter 126 and among these, the second light shielding layer 128 is arranged on the side close to the light emitting device 120. In this way, the distance from the organic EL layer 138 to the second light shielding layer 128 becomes closer and light emitted in a diagonal direction is absorbed by the second light shielding layer 128 from a frontal position facing an adjacent pixel. As a result, even if the length X1 and X2 of an amount protruding from a light shielding layer is short, the effects of absorbing light emitting in a diagonal direction are obtained and improvement effects in viewing angle characteristics are obtained. That is, by arranging a wider second shielding layer than a first light shielding layer sandwiching a color filter layer, it is possible to bring the second light shielding layer close to a pixel by at least the amount of the thickness of a color filter, and because it is possible to increase the optical distance when light passes through the second light shielding layer with respect to light emitted in a diagonal direction from a pixel towards an adjacent pixel, it is possible to sufficiently attenuate that light emitted in a diagonal direction.

Furthermore, because light emitted in a diagonal direction at more than a certain angle is not emitted to the exterior due to total reflectance caused by a refractive index difference between a color filter an air at their interface, it is not necessary to widen the width of X1 and X2 more than necessary.

Although a part of light emitted from a pixel which passes through a semi-transparent layer is absorbed, the remaining transparent light can be extracted to the exterior as emitted light of the pixel. In addition, because X1 and X2 are short, the area of a semi-transparent layer which takes up the aperture part of a light shielding layer is also small and thereby it is possible to reduce the effect of the semi-transparent layer and control a drop in light usage efficiency. Therefore, it is possible to achieve both an improvement in viewing angle characteristics and control a drop in light usage efficiency.

In this way, it is possible to reduce the effect of a second light shielding layer by reducing the length by which the second light shielding layer protrudes from a first light shielding layer and increase light usage efficiency compared to the case where only the first light shielding layer is arranged at the same width. In this way, it is possible to achieve both an improvement in viewing angle characteristics and control a drop in light usage efficiency.

According to the display device shown in the present embodiment, by arranging a semi-transparent layer arranged to overlap a light shielding layer near a light emitting device, it is possible for light emitted in a diagonal direction from the light emitting device by the semi-transparent layer. Using this structure it is possible to reduce light leaking to an adjacent pixel. That is, because the light path length of light emitted in a diagonal direction reaching an adjacent pixel and which passes through a semi-transparent layer becomes longer, it is possible to efficiently absorb the light using the semi-transparent layer until it reaches a color filter with a different color of an adjacent pixel. As a result, it is possible to improve viewing angle characteristics due to mixed colors while controlling a drop in light usage efficiency and improve overall image quality in a display device. That is, by arranging a wider second light shielding layer than a first light shield layer on the side of a pixel, it is possible to increase the optical distance when light passes through the second light shielding layer with respect to light emitted in a diagonal direction from a pixel towards an adjacent pixel and thereby it is possible to sufficiently attenuate that light emitted in a diagonal direction.

[Second Embodiment]

Figure 4A:
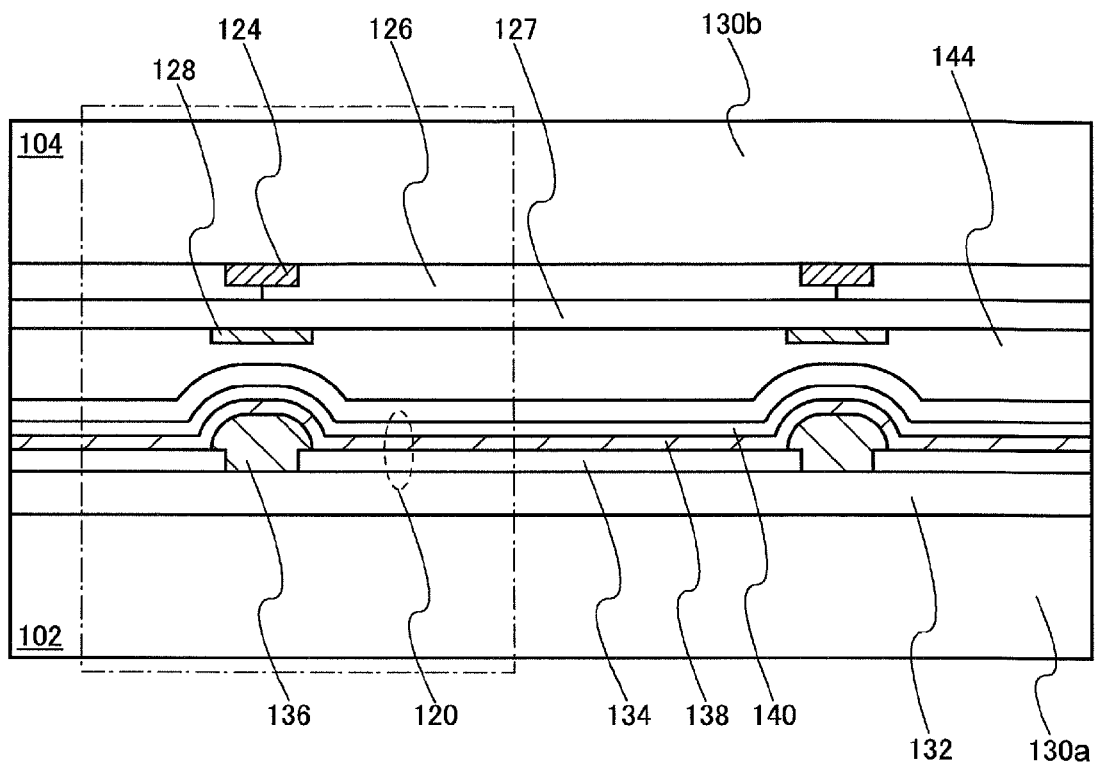
FIG. 4A is a cross-sectional view of the structure of a pixel region of a display device related to one embodiment of the present invention.
Figure 4B:
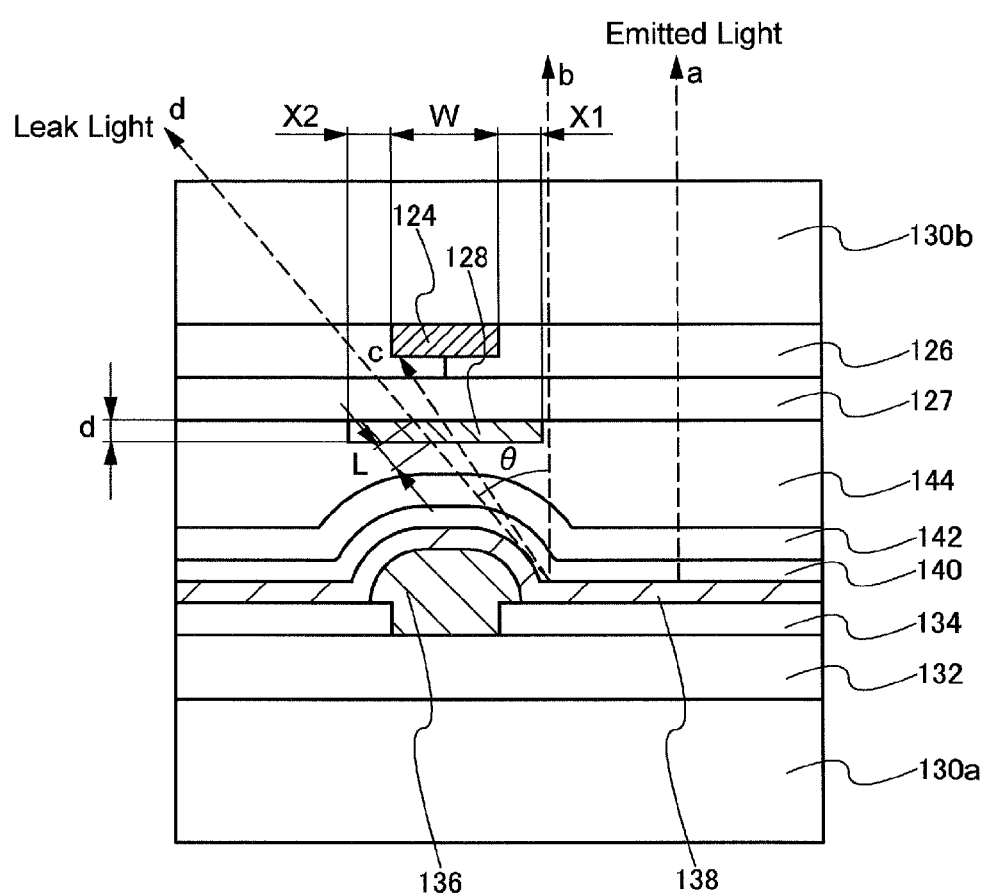
FIG. 4B explains the structure of a pixel region of a display device related to FIG. 4A, and is a diagram for explaining the appearance when light emitted in a diagonal direction by a second light shielding layer is absorbed.

FIG. 4 (A) shows a structure wherein a second light shielding layer 128 with light absorbing properties arranged above an overcoat layer 127 in a pixel region and an expanded view of part enclosed by a dashed line is shown in FIG. 4 (B). Other than further reducing the distance from an organic EL layer 138 to the second light shielding layer 128 by arranging the second light shielding layer above the overcoat layer 127, the remainder is the same as the first embodiment.

When the second light shielding layer 128 is arranged above the overcoat layer 127, light emitted in a diagonal direction from a pixel (path d) begins to be absorbed by the second light shield layer 128 from a frontal position facing an adjacent pixel. As a result, even if the length X1 and X2 of an amount protruding from the first light shielding layer 124 is short, the improvement effects in viewing angle characteristics are obtained the same as the first embodiment. Furthermore, because it is possible to reduce the area of the second light shielding layer 128 which takes up the aperture part of the first light shielding layer 124, it is possible to reduce the effect of the second light shielding layer 128 and further increase light usage efficiency (intensity of emitted light in a pixel).

Modified Example 1

Figure 5A:
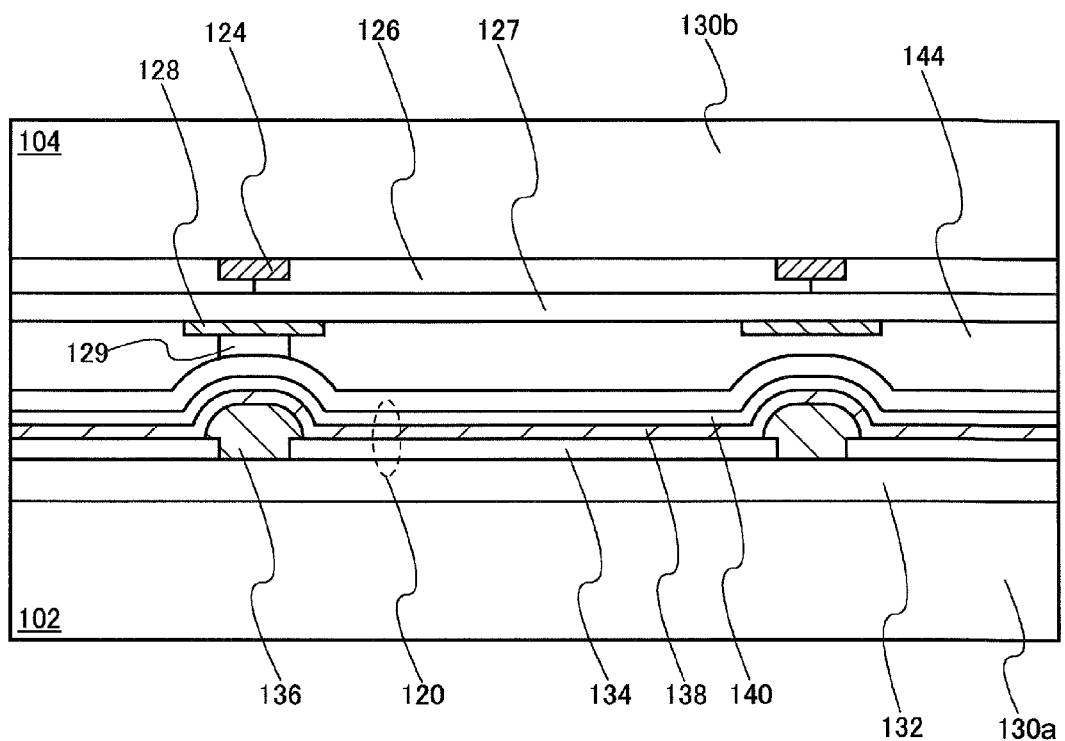
FIGS. 5A and 5B is a cross-sectional diagram for explaining the structure of a pixel region of a display device related to embodiment of the present invention.
Figure 5B:
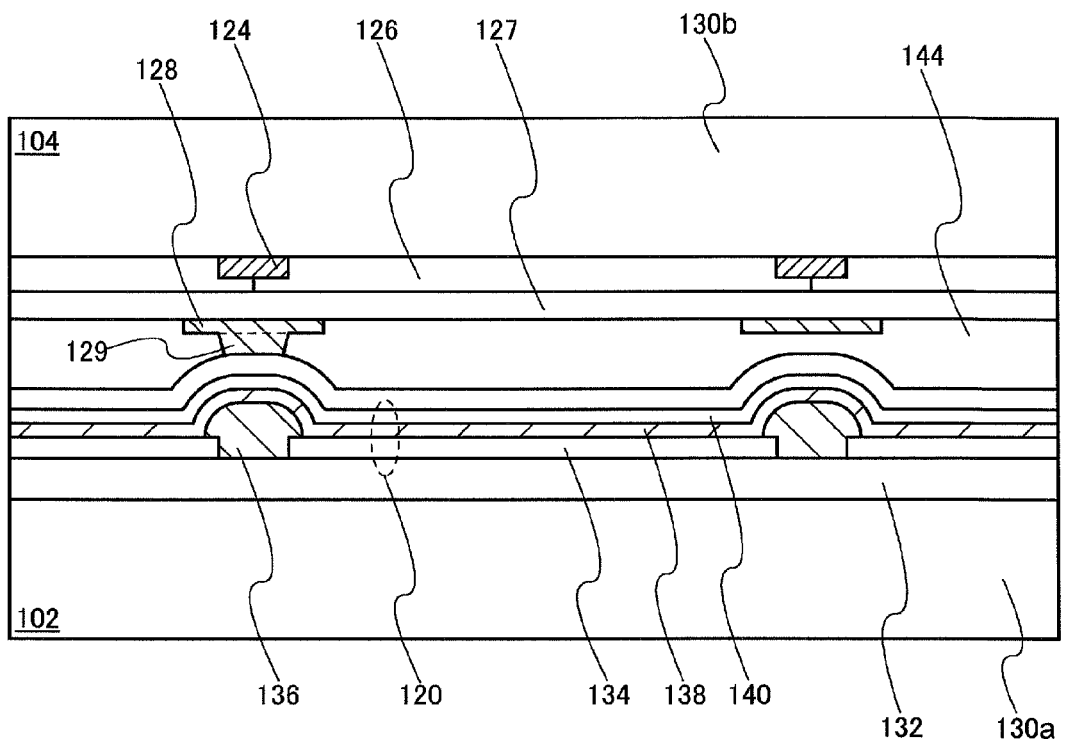

FIG. 5 (A) shows an example of arranging a spacer 129 above the second light shielding layer 128 arranged above the overcoat layer 127. The thickness of the spacer 129 is about the same as the filling layer 144 or is made even thinner. That is, because the spacer 129 is arranged in a region which roughly overlaps the bank layer 136, it is preferred that the thickness of the spacer 129 is formed thinner than the filling layer 144 by the amount of the thickness of the bank layer 136. By arranging the spacer 129 with this type of thickness, it is possible to stick together a device substrate 102 and color filter 104 while maintaining a uniform interval. In this case, by arranging the spacer 129 in an inner region (region roughly overlapping the first light shielding layer 124) of the second light shielding layer 128, it is possible to prevent a drop in the aperture ratio of a pixel.

By bringing the device substrate 102 and the color filter substrate 104 as close together as possible, it is possible to further reduce the distance between the second light shielding layer 128 and the organic EL layer 138. In this way, even if the length X1 and X2 of the second light shielding layer 128 of an amount protruding from the first light shielding layer 124 is short, an improvement in the effects of viewing angle characteristics is obtained the same as the first embodiment.

In FIG. 5 (B), a spacer function is combined by making the film thickness of the second light shielding layer 128 different between a center region and a periphery region and by making the center region thin. The second light shielding layer having this shape can be created by forming a resist mask and etching two times separately. In addition, if a halftone mask as a photo mask is used when forming a resist mask, it is possible to delete the process for creating a resist mask.

By arranging the second light shielding layer 128 with a thinner center region compared to a periphery edge region, the diagonal light component which enters this film thickness region becomes absorbed by the second light shielding layer 128 and thus it is possible to reduce light leaking to an adjacent pixel.

[Third Embodiment]

Figure 6A:
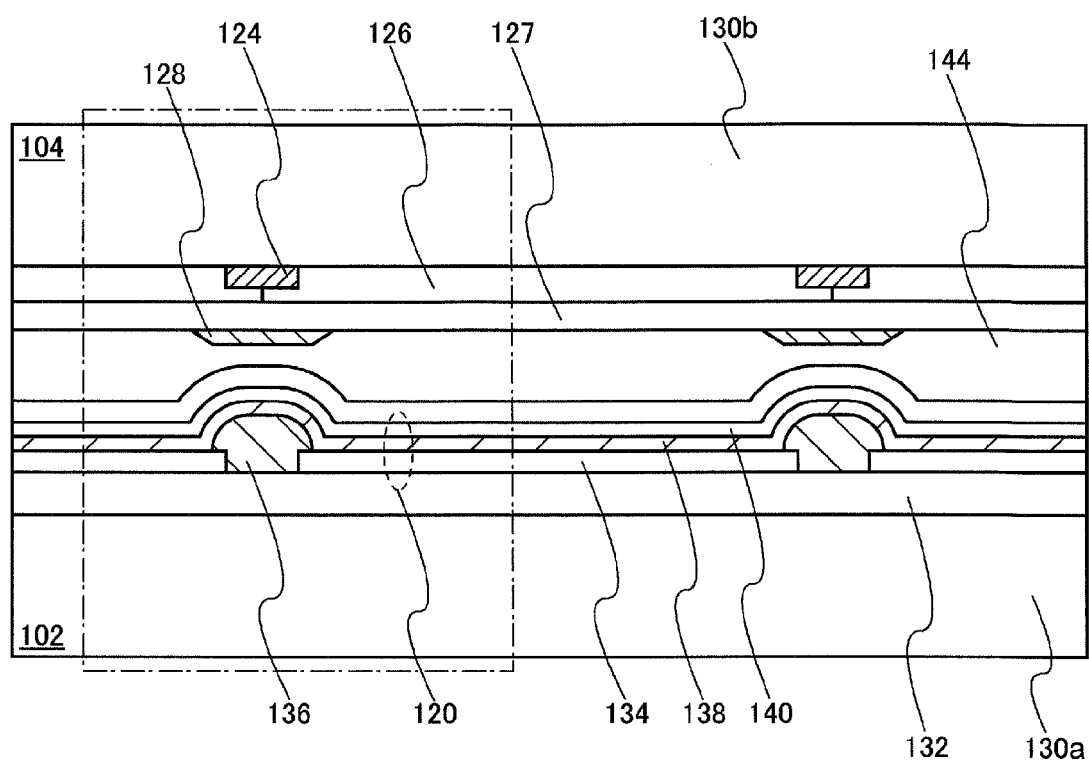
FIG. 6A is a cross-sectional view of the structure of a pixel region of a display device related to one embodiment of the present invention.
Figure 6B:
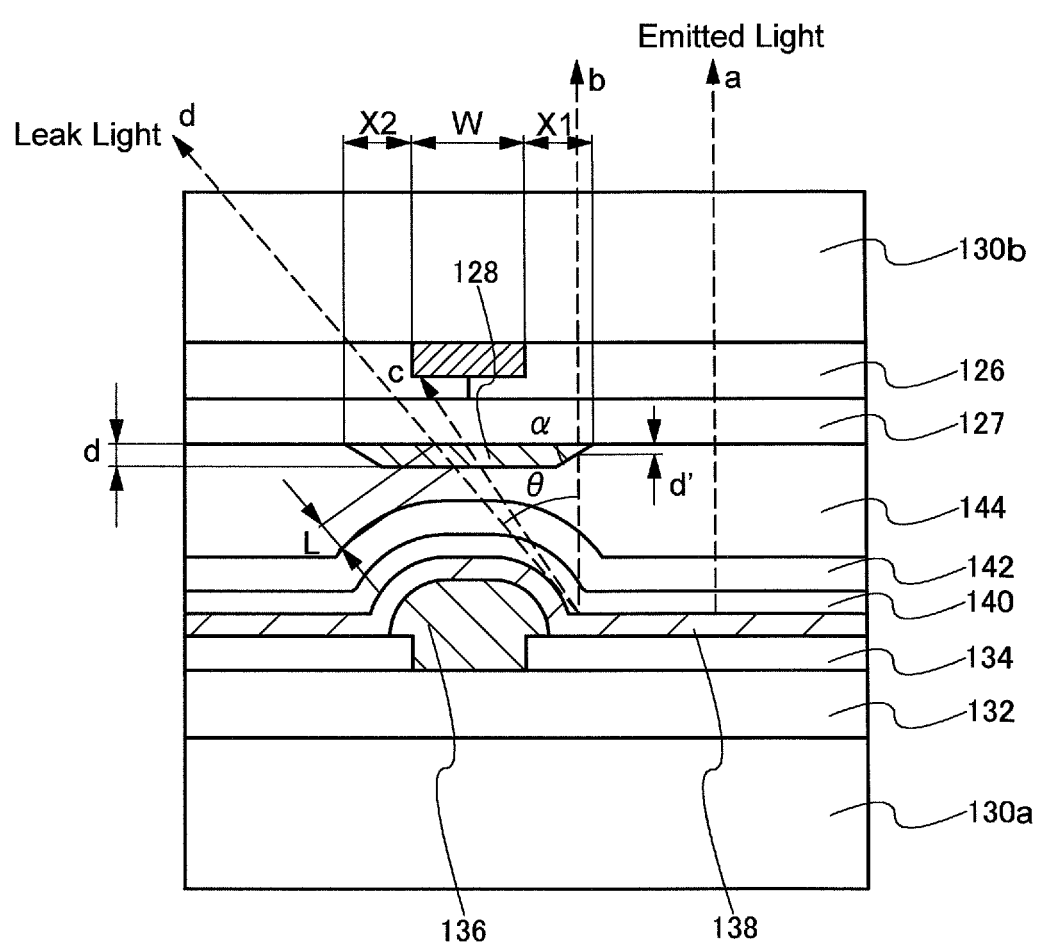
FIG. 6B explains the structure of a pixel region of a display device related to FIG. 6A, and is a diagram for explaining the appearance when light emitted in a diagonal direction by a second light shielding layer is absorbed.

FIG. 6 (A) shows the structure wherein a second light shielding layer 128 with light absorbing properties is arranged above an overcoat layer 127 in a pixel region and an expanded view of part enclosed by a dotted line is shown in FIG. 6 (B). Other than forming a taper shape by gradually reducing the film thickness of an edge part of the second light shielding layer 128 in addition to arranging the second light shielding layer 128 above the overcoat layer 127, the remainder is the same as the second embodiment.

Because light emitted diagonally at an angle θ max above a certain angle among the light emitted in a diagonal direction from a pixel is all reflected due to a refractive index difference between a support substrate 130b and air at their interface, it is possible ignore this light since it is not emitted to the exterior.

On the other hand, with respect to light emitted in a diagonal direction within an angle range where it becomes leaking light (path d), even if an edge part of the second light shielding layer 128 includes a taper shape, if a taper angle α is set to (90°−θ max) or more, it is possible to secure a light path length L which passes diagonally through a semi-transparent layer the same as that shown in the first and second embodiments.

As a result, it is possible to absorb light emitted in a diagonal direction to an adjacent pixel, reduce mixed colors and maintain the improvement effects of viewing angle characteristics. In addition, with respect to light which passes through a semi-transparent layer among the light emitted from a pixel, because the thickness d' of a semi-transparent layer having light absorbing properties is smaller in the taper part than a usual part and a light path length which passes through the semi-transparent layer as emitted light of a pixel is short, the amount of light absorbed compared to the second embodiment is smaller and it is possible to control a drop in the usage efficiency of light emitted to a pixel. In other words, by making the edge part of the light shielding layer 128 a taper shape, it is possible to reduce the light path length which passes through the second light shielding layer with respect to emitted light of a pixel while maintaining the effects of attenuating the light emitted in a diagonal direction which becomes leaked light.

Modified Example 2

Figure 7A:
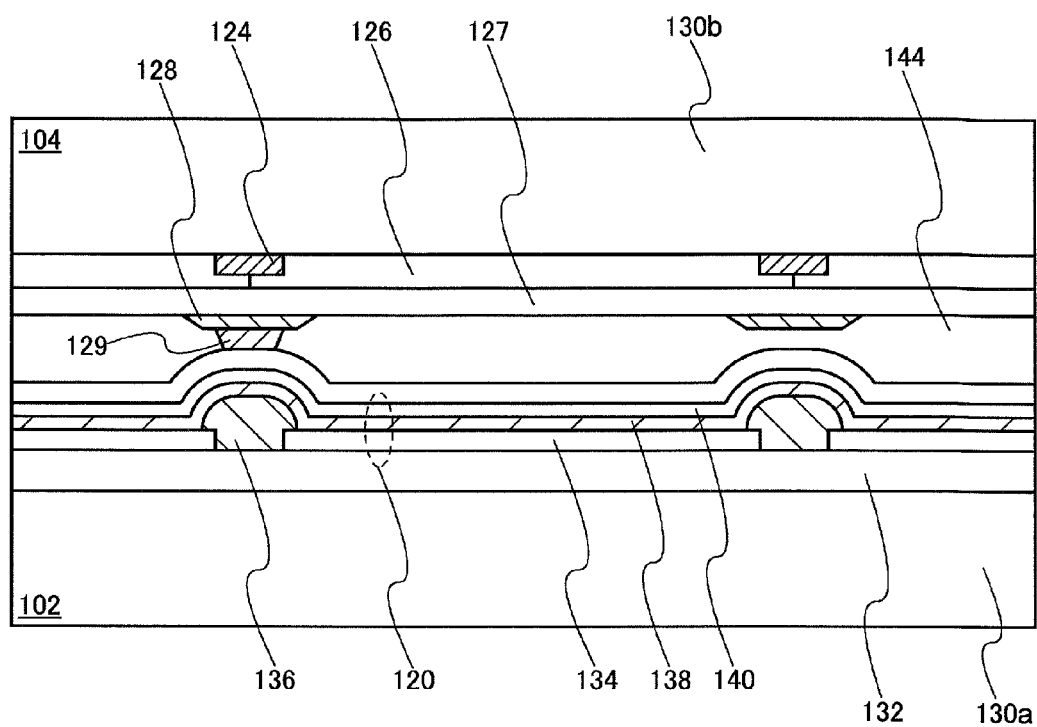
FIGS. 7A and 7B is a cross-sectional diagram for explaining the structure of a pixel region of a display device related to embodiment of the present invention.
Figure 7B:
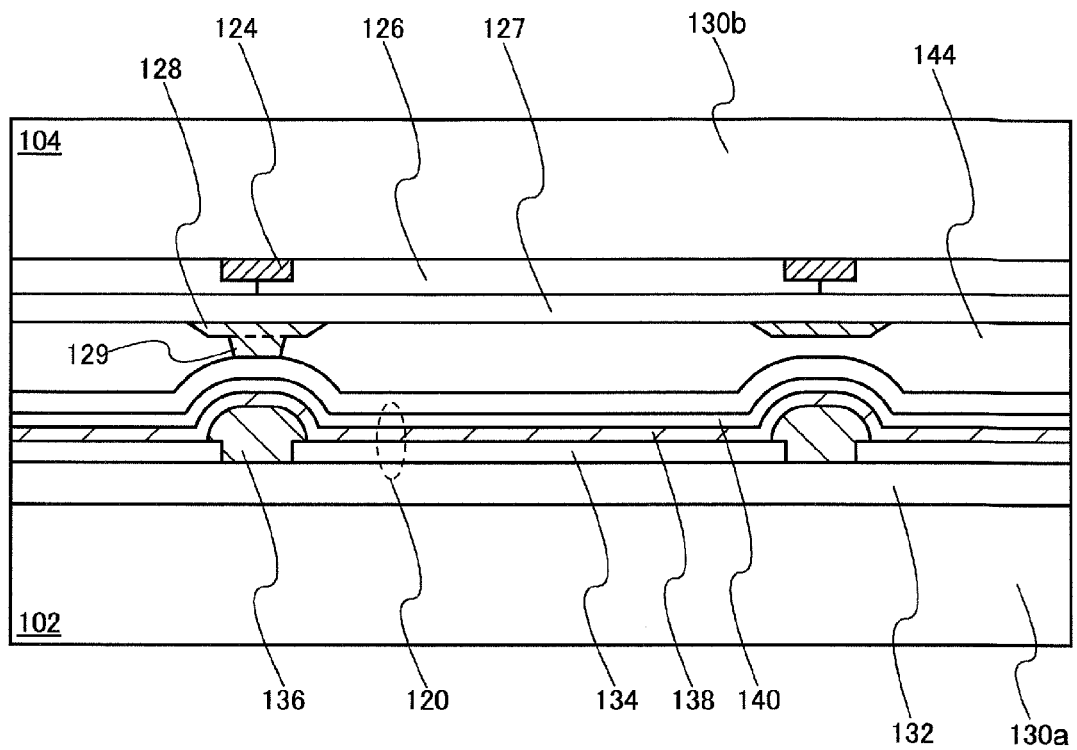

FIG. 7 (A) shows an example of a structure wherein the second light shielding layer 128 including an edge part with a taper shape is arranged above the overcoat layer 127 and a spacer 129 is arranged to overlap the second light shielding layer 128. The thickness of the spacer 129 is about the same as the thickness of the filler layer 144 and is preferably 1 μm~4 μm and more preferably 2 μm~3 μm. By arranging the spacer 129 it is possible to stick the device substrate 102 and color filter substrate 104 together while maintaining a uniform interval. In addition, by bringing the device substrate 102 and the color filter substrate 104 as close together as possible, it is possible to further reduce the distance between the second light shielding layer 128 and the organic EL layer 138, and thereby even if the length X1 and X2 of the second light shielding layer 128 of an amount protruding from the first light shielding layer 124 is short, an improvement in the effects of viewing angle characteristics is obtained the same as the first and second embodiments.

In FIG. 7 (B), a spacer function is combined by making the film thickness of the second light shielding layer 128 different between a center region and a periphery region and by making the center region thin. The second light shielding layer combining this spacer function can be created in the same way as in the case in FIG. 5 (B).

By arranging the second light shielding layer 128 with a center region having this type of thin film thickness, the diagonal light component entering this film thickness region is absorbed by the second light shielding layer 128 and it is possible to further reduce light leaking to an adjacent pixel.

[Fourth Embodiment]

Figure 8A:
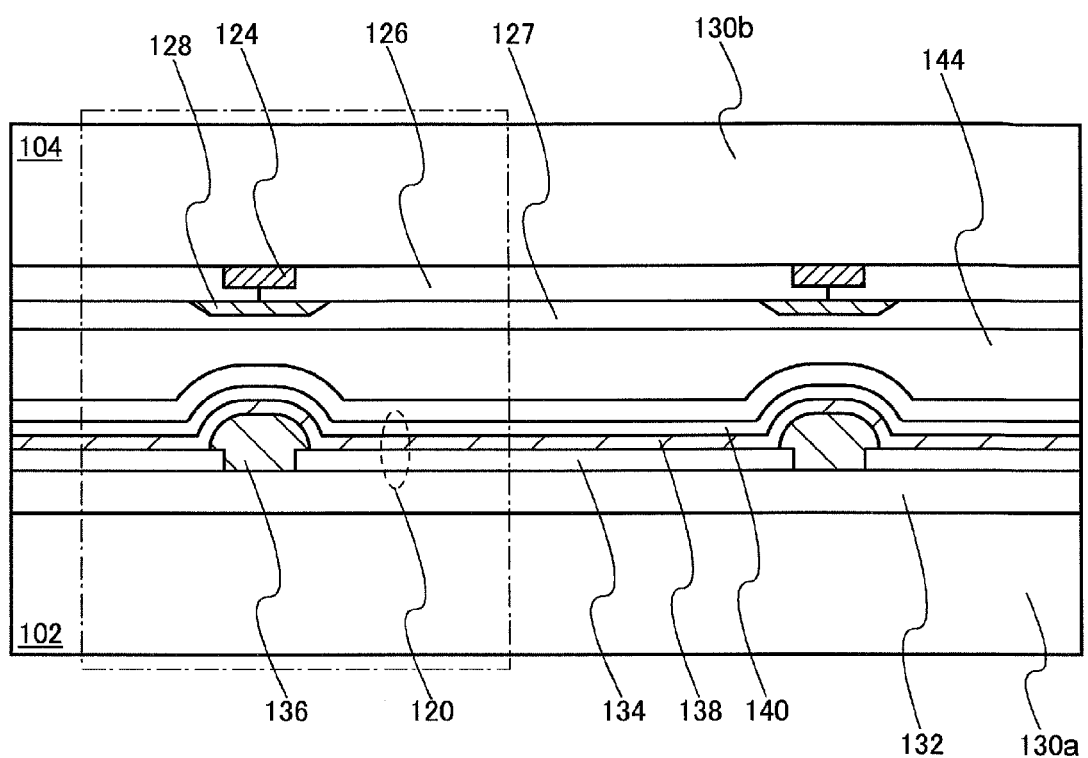
FIG. 8A is a cross-sectional view of the structure of a pixel region of a display device related to one embodiment of the present invention.
Figure 8B:
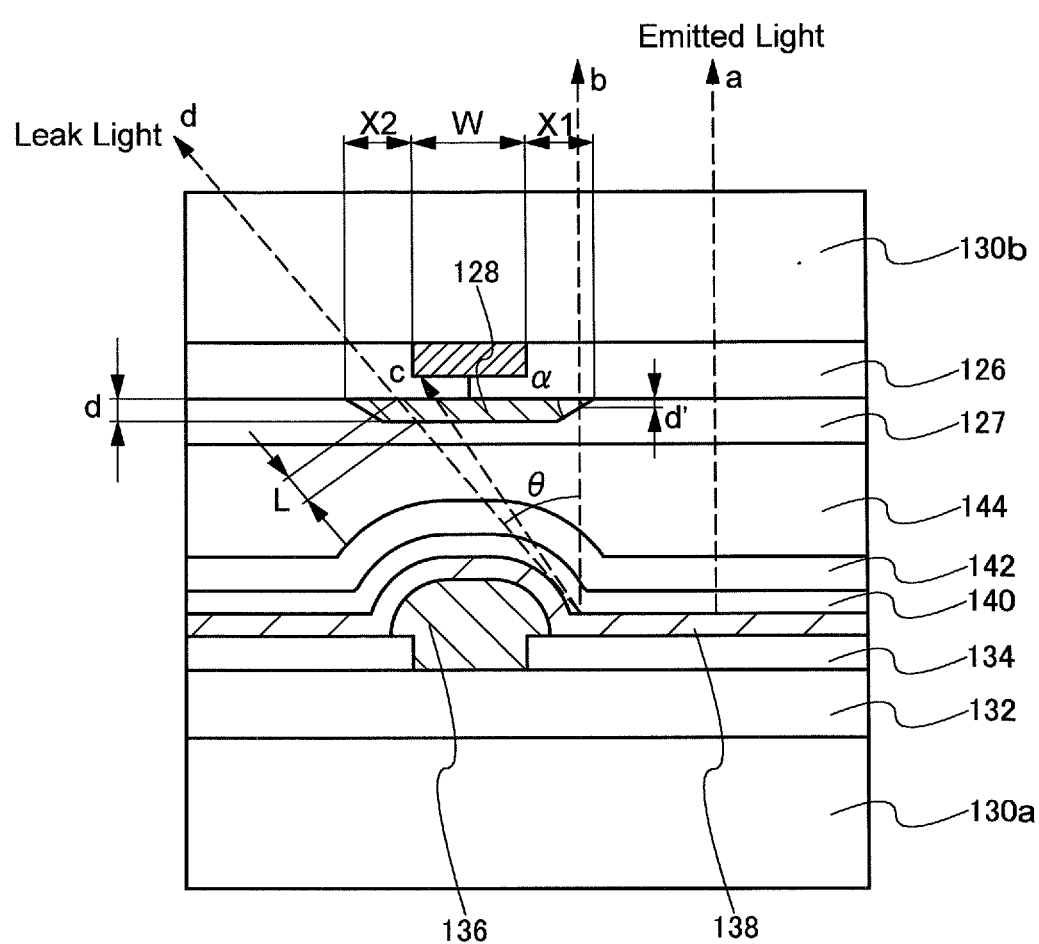
FIG. 8B explains the structure of a pixel region of a display device related to FIG. 8A, and is a diagram for explaining the appearance when light emitted in a diagonal direction by a second light shielding layer is absorbed.

FIG. 8 (A) shows a structure wherein the second light shielding layer 128 having light absorbing properties is arranged above the color filter layer 126 in a pixel region and an expanded view of the part enclosed by a dotted line is shown in FIG. 8 (B). Other than arranging the second light shielding layer 128 above the color filter layer 126, the remainder is the same as the third embodiment.

An edge part of the light shielding layer 128 has a taper shape and similar to the case in the third embodiment it is possible to absorb light emitted in a diagonal direction to an adjacent pixel, reduce mixed colors and further control a drop in the usage efficiency of light emitted to a pixel compared to the first embodiment while maintaining the improvement effects of viewing angle characteristics.

[Fifth Embodiment]

Figure 9A:
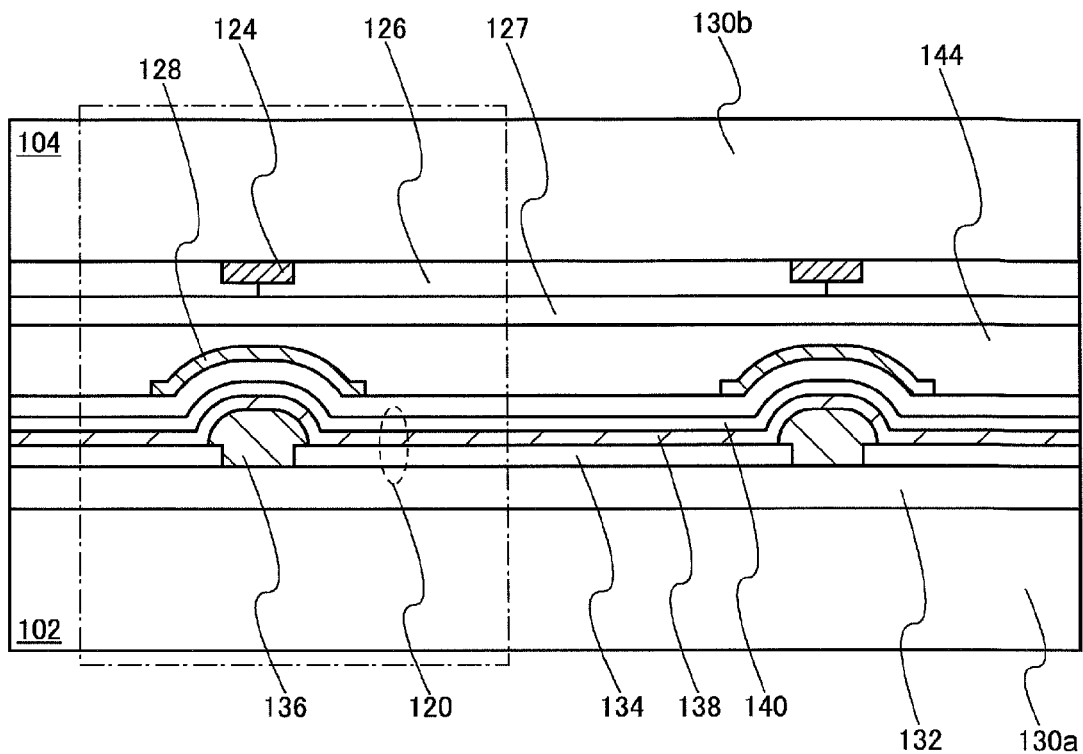
FIG. 9A is a cross-sectional view of the structure of a pixel region of a display device related to one embodiment of the present invention.
Figure 9B:
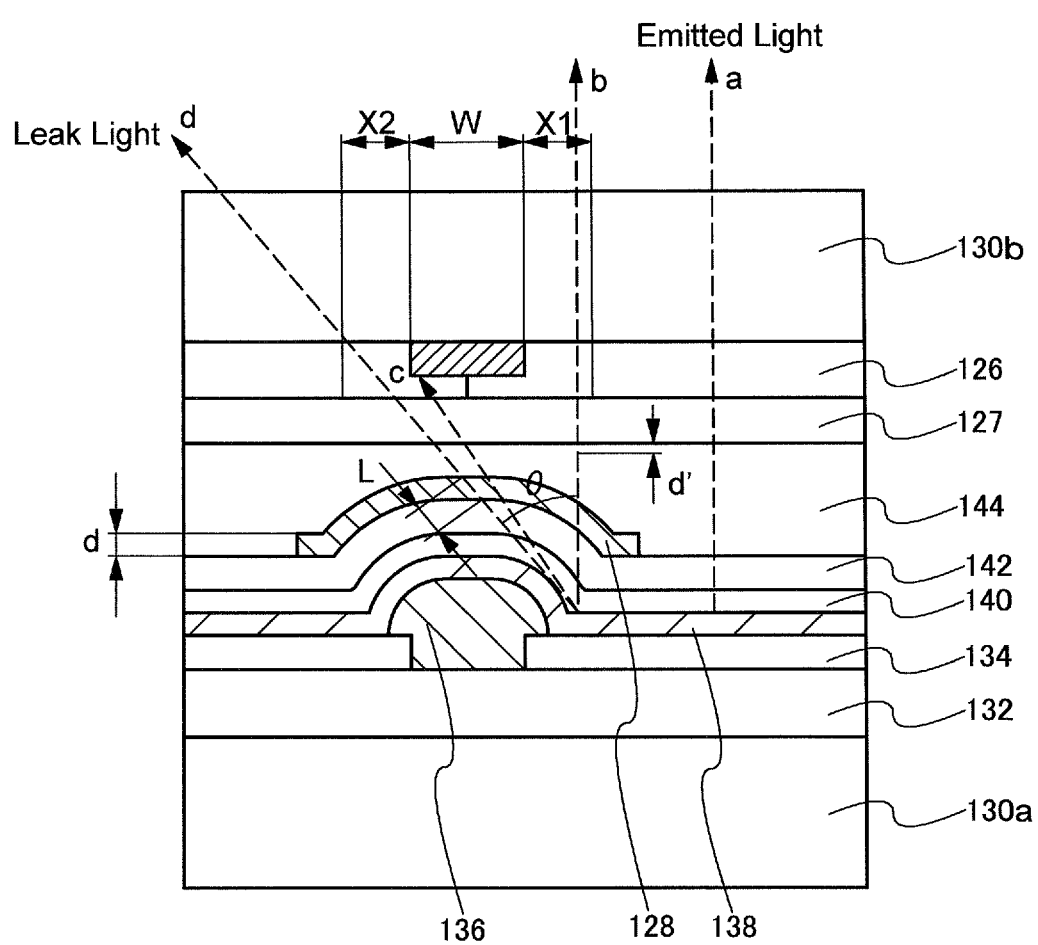
FIG. 9B explains the structure of a pixel region of a display device related to FIG. 9A, and is a diagram for explaining the appearance when light emitted in a diagonal direction by a second light shielding layer is absorbed.
Figure 10A:
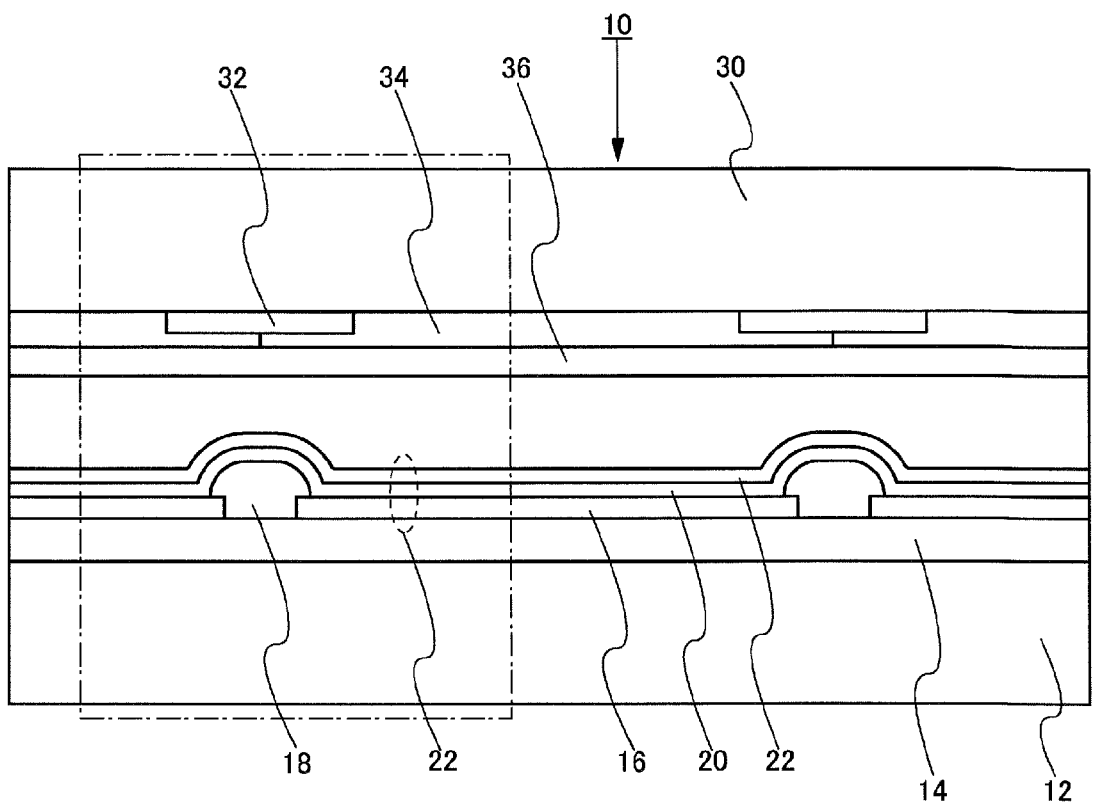
FIGS. 10A and 10B is a diagram showing an example of a display device.
Figure 10B:
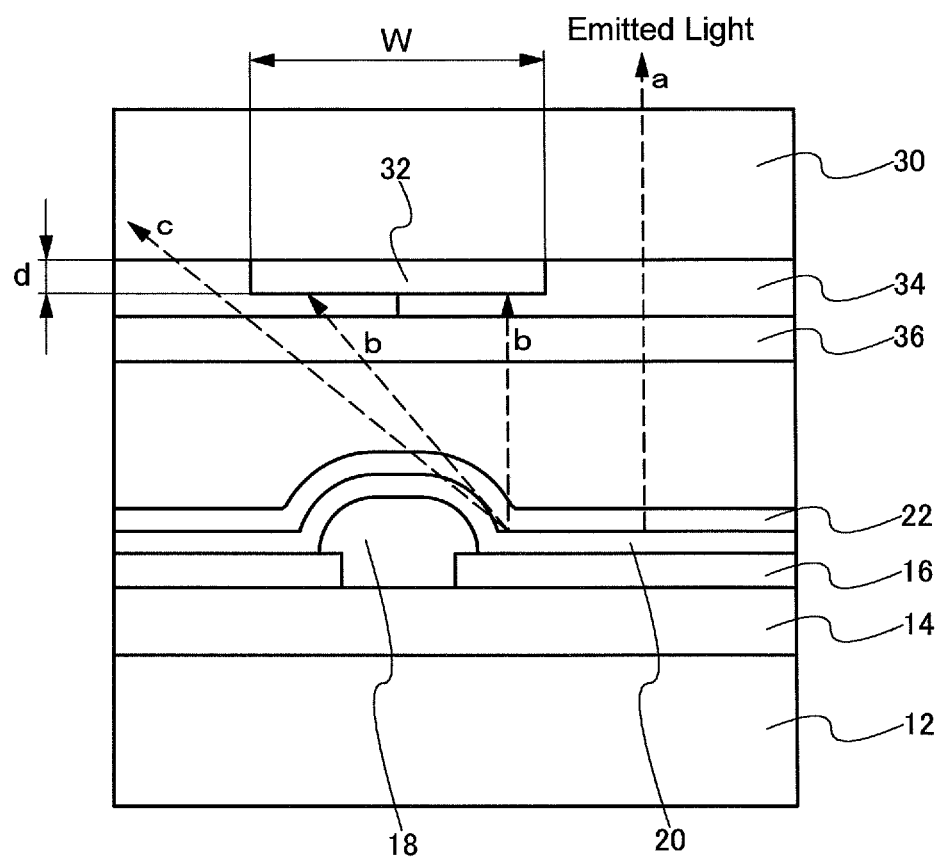

The present embodiment shows an example wherein the second light shielding layer 128 is arranged not on the side of the color filter substrate 104 but on the side of the device substrate 102. In FIG. 9 (A), a structure wherein the second light shielding layer 128 having light absorbing properties is arranged above a sealing layer 142 of the device substrate 102 in a pixel region and an expanded view of the part enclosed by a dotted line is shown in FIG. 9 (B).

The second light shielding layer 128 may be formed from a metal layer having a certain pattern using a shadow mask by a sputtering method. In addition, the light shielding layer may also be formed using not metal but an organic resin having light absorbing properties comprised from a photosensitive resin including a black segment such as titanium black or carbon black.

When the second light shielding layer 128 is arranged above the sealing layer 142, because it is possible to further reduce the distance from the organic EL layer 138 to the second light shielding layer 128, in addition to obtaining the viewing angle characteristics of the first embodiment, it is possible to further reduce the area of the semi-transparent layer which takes up the aperture part of the light shielding layer, reduce the effect of a semi-transparent layer and control a drop in light usage efficiency.

According to the present embodiment, by arranging a wider second light shielding layer than a first light shielding layer above a sealing layer of an device substrate, it is possible to bring the second light shielding layer closer to a pixel, and because it is possible to increase the optical distance when light passes through the second light shielding layer with respect to light emitted in a diagonal direction from a pixel towards an adjacent pixel, it is possible to sufficiently attenuate that light emitted in a diagonal direction.

What is claimed is:

1. A display device comprising:
    a device substrate arranged with a plurality of pixels and a bank layer; and
    a color filter substrate includes a color filter layer with different transparent wavelength bands corresponding to each of the pixels, a first light shielding layer, and a second color filter layer;
    wherein
    each of the plurality of pixels includes a light emitting device having a pixel electrode, an organic electroluminescence layer, and an upper part electrode;
    the bank layer arranged on the boundary region of the plurality of pixels, the bank layer covering a peripheral portion of the pixel electrode;
    the color filter layer arranged above a translucent support substrate, the color filter layer includes a first color filter layer having a first transparent wavelength band, a second color filter layer having a second transparent wavelength band, and a third color filter layer having a third transparent wavelength band;
    the first light shielding layer arranged corresponding to a boundary region of the plurality of pixels and surround the plurality of pixels, the second light shielding layer arranged to overlap the first light shielding layer and surrounding the plurality of pixels, and the first light shielding layer and the second light shielding layer sandwiching the color filter layer with no other layer in between;
    the first light shielding layer is arranged corresponding to each of a boundary region of the first color filter layer, the second color filter layer, and the third color filter layer, and the first light shielding layer is arranged over the surface opposite to the second light shielding layer of the color filter layer, and the second light shielding layer overlaps the first light shielding layer in a plan view and the second light shielding layer arranged over the bank layer;
    the second light shielding layer having a higher transparency than the first light shielding layer and a lower transparency than the translucent support substrate; and
    the second light shielding layer is wider than the first light shielding layer and is arranged on the side of the light emitting device than the first light shielding layer.

2. The display device according to claim 1 wherein the color filter substrate includes an overcoat layer on an opposite side of the translucent support substrate of the color filter layer, and the second light shielding layer is arranged between the color filter layer and the overcoat layer.

3. The display device according to claim 1 wherein an edge part of the second light shielding layer has a taper shape, the thickness of the taper shape gradually decreasing.

4. The display device according to claim 1 wherein transparency of the second light shielding layer in a thickness direction is in a range of 25%~70%.

5. The display device according to claim 1 wherein optical density of the first light shielding layer in a thickness direction is 3.0 or more.

6. A display device comprising:
    a device substrate arranged with a plurality of pixels and a bank layer; and
    a color filter substrate includes a color filter layer with different transparent wavelength bands corresponding to each of the pixels, a first light shielding layer, and a second color filter layer;
    wherein
    each of the plurality of pixels includes a light emitting device having a pixel electrode, an organic electroluminescence layer, and an upper part electrode;
    the bank layer arranged on the boundary region of the plurality of pixels, the bank layer covering a peripheral portion of the pixel electrode;
    the color filter layer arranged above a translucent support substrate, the color filter layer includes a first color filter layer having a first transparent wavelength band, a second color filter layer having a second transparent wavelength band, and third color filter layer having a third transparent wavelength band;
    the first light shielding layer arranged corresponding to a boundary region of the plurality of pixels and surrounding the plurality of pixels, the first light shielding layer arranged on the translucent support substrate side of the color filter layer, and the second light shielding layer arranged to overlap the first light shielding layer and surrounding the plurality of pixels, the second light shielding layer arranged on the opposite side of the translucent support substrate of the color filter layer to overlap the first light shielding layer, and the first light shielding layer and the second light shielding layer sandwiching the color filter layer with no other layer in between;
    the first light shielding layer is arranged corresponding to each of a boundary region of the first color filter layer, the second color filter layer, and the third color filter layer, and the first light shielding layer is arranged over the surface opposite to the second light shielding layer of the color filter layer, and the second light shielding layer overlaps the first light shielding layer in a plan view, and the second light shielding layer arranged over the bank layer;

the second light shielding layer having a higher transparency than the first light shielding layer and a lower transparency than the translucent support substrate; and the second light shielding layer is wider than the first light shielding layer.

7. The display device according to claim 6 wherein the color filter substrate includes an overcoat layer on an opposite side of the translucent support substrate of the color filter layer, and the second light shielding layer is arranged between the color filter layer and the overcoat layer.

8. The display device according to claim 6 wherein an edge part of the second light shielding layer has a taper shape, the thickness of the taper shape gradually decreasing.

9. The display device according to claim 6 wherein transparency of the second light shielding layer in a thickness direction is in a range of 25%~70%.

10. The display device according to claim 6 wherein the color filter substrate includes an overcoat layer on an opposite side of the translucent support substrate of the color filter layer, and the second light shielding layer is arranged above the overcoat layer.

11. A display device comprising:
a device substrate arranged with a plurality of pixels and a bank layer; and
a color filter substrate includes a color filter layer with different transparent wavelength bands corresponding to each of the pixels and a first light shielding layer and a second color filter layer;
wherein
each of the plurality of pixels includes a light emitting device having a pixel electrode, an organic electroluminescence layer and an upper part electrode,
the bank layer arranged on the boundary region of the plurality of pixels, the bank layer covering a peripheral portion of the pixel electrode,
the color filter layer arranged above a translucent support substrate, the color filter layer includes a first color filter layer having a first transparent wavelength band, a second color filter layer having a second transparent wavelength band and third color filter layer having a third transparent wavelength band,
the first light shielding layer arranged corresponding to a boundary region of the plurality of pixels and surrounding the plurality of pixels, the first light shielding layer arranged on a bottom layer side of the color filter layer with no other layer in between,
the device substrate includes a sealing layer arranged on a top layer side of the light emitting device, and the second light shielding layer arranged corresponding to a boundary region of the plurality of pixels above the sealing layer and surrounding the plurality of pixels,
the first light shielding layer is arranged corresponding to each of a boundary region of the first color filter layer, the second color filter layer and the third color filter layer,
and the second light shielding layer is arranged on the sealing layer and overlaps the first light shielding layer in a plan view and the second light shielding layer arranged over the bank layer,
the color filter layer is arranged over the surface opposite to the second light shielding layer of the bank layer,
the first light shielding layer is arranged over the surface opposite to the color filter layer of the second light shielding layer,
the second light shielding layer having a higher transparency than the first light shielding layer and a lower transparency than the translucent support substrate; and
the second light shielding layer is wider than the first light shielding layer.

12. The display device according to claim 11 wherein the color filter substrate includes an overcoat layer on an opposite side of the translucent support substrate of the color filter layer, and the second light shielding layer is arranged between the color filter layer and the overcoat layer.

13. The display device according to claim 11 wherein an edge part of the second light shielding layer has a taper shape, the thickness of the taper shape gradually decreasing.

14. The display device according to claim 11 wherein transparency of the second light shielding layer in a thickness direction is in a range of 25%~70%.

15. The display device according to claim 11 wherein optical density of the first light shielding layer in a thickness direction is 3.0 or more.

* * * * *